(12) United States Patent
Chakraborty et al.

(10) Patent No.: US 8,911,518 B1
(45) Date of Patent: *Dec. 16, 2014

(54) METHOD AND SYSTEM FOR DICING SUBSTRATES CONTAINING GALLIUM AND NITROGEN MATERIAL WITH CONDUCTIVE CORE VIA STRUCTURES

(75) Inventors: Arpan Chakraborty, Goleta, CA (US);
Michael R. Krames, Goleta, CA (US);
Tal Margalith, Fremont, CA (US);
Rafael Aldaz, Fremont, CA (US)

(73) Assignee: Soraa, Inc., Fremont, CA (US)

( * ) Notice: Subject to any disclaimer, the term of this patent is extended or adjusted under 35 U.S.C. 154(b) by 97 days.

This patent is subject to a terminal disclaimer.

(21) Appl. No.: 13/491,483

(22) Filed: Jun. 7, 2012

Related U.S. Application Data

(63) Continuation-in-part of application No. 13/298,617, filed on Nov. 17, 2011, now Pat. No. 8,597,967.

(60) Provisional application No. 61/414,817, filed on Nov. 17, 2010.

(51) Int. Cl.
*H01L 21/00* (2006.01)

(52) U.S. Cl.
USPC .......... 48/33; 257/95; 257/615; 257/620; 257/E33.023; 257/E29.107; 438/28; 438/462

(58) Field of Classification Search
USPC .......... 257/95, 615, 620, E29.107, E33.023; 438/28, 33, 462
See application file for complete search history.

(56) References Cited

U.S. PATENT DOCUMENTS

| | | | |
|---|---|---|---|
| 6,855,959 B2 * | 2/2005 | Yamaguchi et al. | 257/98 |
| 2004/0089919 A1 * | 5/2004 | Motoki et al. | 257/613 |
| 2005/0025205 A1 * | 2/2005 | Ryowa et al. | 372/44 |
| 2006/0097278 A1 * | 5/2006 | Goto et al. | 257/103 |
| 2006/0272572 A1 * | 12/2006 | Uematsu et al. | 117/84 |
| 2006/0286695 A1 * | 12/2006 | Yanashima et al. | 438/22 |

* cited by examiner

*Primary Examiner* — Su Kim
(74) *Attorney, Agent, or Firm* — Kilpatrick Townsend & Stockton LLP

(57) ABSTRACT

The present disclosure relates generally to semiconductor techniques. More specifically, embodiments of the present disclosure provide methods for efficiently dicing substrates containing gallium and nitrogen material. Additionally, the present disclosure provides techniques resulting in an optical device comprising a substrate having a dislocation bundle center being used as a conductive region for a contact.

13 Claims, 8 Drawing Sheets

METHOD AND SYSTEM FOR DICING SUBSTRATES CONTAINING GALLIUM AND NITROGEN MATERIAL WITH CONDUCTIVE CORE VIA STRUCTURES

CROSS-REFERENCES

This application is a continuation in part of U.S. application Ser. No. 13/298,617 filed on Nov. 17, 2011, which claims priority to U.S. Provisional Application No. 61/414,817, filed on Nov. 17, 2010, each of which is incorporated by reference in its entirety herein.

FIELD

The present disclosure relates generally to semiconductor techniques, more particularly, to methods for efficiently dicing substrates containing gallium and nitrogen material.

BACKGROUND

The present disclosure relates generally to semiconductor techniques. More specifically, embodiments of the present disclosure provide methods and systems for efficiently dicing substrates containing gallium and nitrogen material. Gallium and nitrogen containing substrates are often used in manufacturing light emitting diodes (LEDs), lasers, and other devices, are typically formed by crystal growth methods, and contain high-dislocation areas that are usable in manufacturing devices. In various embodiments, this disclosure provides techniques for dicing substrates based on patterns of the high-dislocation areas.

In the late 1800's, Thomas Edison invented the light bulb. The conventional light bulb, commonly called the "Edison bulb," has been used for over one hundred years. The conventional light bulb uses a tungsten filament enclosed in a glass bulb sealed in a base, which is screwed into a socket. The socket is coupled to an AC power or DC power source. The conventional light bulb can be found commonly in houses, buildings, outdoor lightings, and other areas requiring light. Unfortunately, drawbacks exist with the conventional Edison light bulb. That is, the conventional light bulb dissipates much thermal energy. More than 90% of the energy used for the conventional light bulb dissipates as thermal energy. Additionally, the conventional light bulb eventually fails due to evaporation of the tungsten filament.

To overcome some of the drawbacks of the conventional light bulb, fluorescent lighting has been developed. Fluorescent lighting uses an optically clear tube structure filled with a noble gas and typically also contains mercury. A pair of electrodes is coupled between the gas and to an alternating power source through a ballast device. Once the mercury has been excited, it discharges to emit UV light. Typically, the optically clear tube is coated with phosphors, which are excited by the UV light to provide white light. Many building structures use fluorescent lighting and, more recently, fluorescent lighting has been fitted onto a base structure, which couples into a standard socket.

Solid state lighting techniques have also been used. Solid state lighting relies upon semiconductor materials to produce light emitting diodes, commonly called LEDs. At first, red LEDs were demonstrated and introduced into commerce. Modern red LEDs use Aluminum Indium Gallium Phosphide or AlInGaP semiconductor materials. Most recently, Shuji Nakamura pioneered the use of InGaN materials to produce LEDs emitting light in the blue color range for blue LEDs. The blue colored LEDs led to innovations such as solid-state white lighting, the blue laser diode, which in turn enabled the Blu-Ray™ DVD player (trademark of the Blu-Ray Disc Association), and other developments. Blue, violet, or ultra-violet-emitting devices based on InGaN are used in conjunction with phosphors to provide white LEDs. Other colored LEDs have also been proposed.

InGaN and GaN based devices, such as LED and laser devices, are often manufactured from substrates that are formed by crystal growth processes. Various conventional techniques have been used in the past to use this type of substrate. Unfortunately, the conventional techniques are often inadequate, either providing an average dislocation density that is too high for device reliability, or in the case of very low-dislocation-density substrates, the presence of localized high-dislocation density regions (e.g., dislocation bundle centers) which are deleterious to device performance.

The organization of the dislocation bundle centers suggests that the disclosed dicing techniques can optimize utilization of the substrate (e.g., dicing in a manner so as to produce the desired devices, while eliminating or reducing waste).

Therefore, it is desirable to have improved techniques for processing devices gallium and nitrogen containing substrates.

BRIEF SUMMARY

In certain embodiments, the present disclosure provides optical devices. An optical device includes a substrate. The substrate has three or more corners, at least one of the corners having at least one dislocation bundle center characterized by a diameter of less than 100 microns. The substrate has a predefined region having at least one dislocation bundle center, which is characterized by a conductivity, e.g., 1 Siemens $cm^{-1}$ or higher. The substrate contains gallium and nitrogen material, e.g., GaN. The substrate has an active region containing one or more active layers, which is positioned within the predefined region. The device has a conductive region comprising the at least one dislocation bundle center provided within the predefined region. In certain embodiments, the substrate is characterized by a substantially triangular shape, the conductivity is suitable as an n-type conductor for the optical device; and wherein the active region comprises a multi-quantum well stack, the multi-quantum well stack having from about two to about thirty quantum wells separated by one or more barriers.

In certain embodiments, the present disclosure provides methods for manufacturing optical devices. The methods include providing a substrate, which comprises gallium and nitrogen material, e.g., GaN. The substrate comprises an active region and a p-type region. The substrate comprises a plurality of dislocation bundle centers. The plurality of dislocation bundle centers being aligned according to a predetermined pattern. The method includes locating at least a first dislocation bundle center and a second dislocation bundle center and isolating at least one dislocation bundle center using an isolation region between the at least one dislocation bundle center and an active region and a p-type region. The method includes separating at least one optical device comprising a portion of the gallium and nitrogen containing substrate configured with at least one dislocation bundle center and using the at least one dislocation bundle center as an n-type contact region.

Still further, embodiments of the present disclosure provide methods for manufacturing optical devices. The methods include providing a substrate, comprising a gallium and nitrogen material. The substrate comprises a plurality of dislocation bundle centers, which are aligned according to a predetermined pattern. The methods include locating at least a first dislocation bundle center and a second dislocation bundle center and defining a first line, the first line connecting the at least the first dislocation bundle center and the second dislocation bundle center. The first line is substantially straight. The methods include locating a third dislocation bundle center, defining a second line, which connects the at least the first dislocation bundle center and the third dislocation bundle center. The second line is substantially straight. The methods include cutting the substrate along the first line, cutting the substrate along the second line, and forming an optical device comprising at least one of the dislocation bundle centers configured as a contact region, such as an n-type contact region. The optical device has a first edge formed by cutting the substrate along the first line.

A further understanding of the nature and advantages of embodiments provided by the present disclosure may be realized by reference to the latter portions of the specification and attached drawings.

DETAILED DESCRIPTION

According to certain embodiments provided by the present disclosure, among other things, gallium and nitrogen containing substrates are often used in manufacturing LEDs, lasers, and other types of devices. Gallium and nitrogen containing substrates are typically formed by crystal growth methods and contain high-dislocation areas that are usable in manufacturing devices. In various embodiments, the present disclosure provides techniques for dicing substrates based on patterns of the high-dislocation areas. There are other embodiments as well.

As mentioned above, conventional techniques for processing substrates are often inadequate. More specifically, GaN substrates often contain high-dislocation-density regions that should be used in forming devices and in particular contact regions, which are conductive. Such regions may be controlled geometrically. For example, cores in GaN substrates are described in *The Journal of Crystal Growth* 305 (2007) pp. 377-383, which is incorporated by reference herein for all purposes. As used herein, the term "cores" refers to high-dislocation regions, which are generally conductive in characteristic. For example, dislocation bundle centers (e.g., cores) are formed during crystal growth processes and may be oriented in an ordered pattern on the substrate according to lithographical masking and growth processes employed for GaN growth such as the hydride vapor phase epitaxy (HVPE) process. In certain embodiments, the dislocation bundle centers are removed, as will be further explained below.

Figure 1:
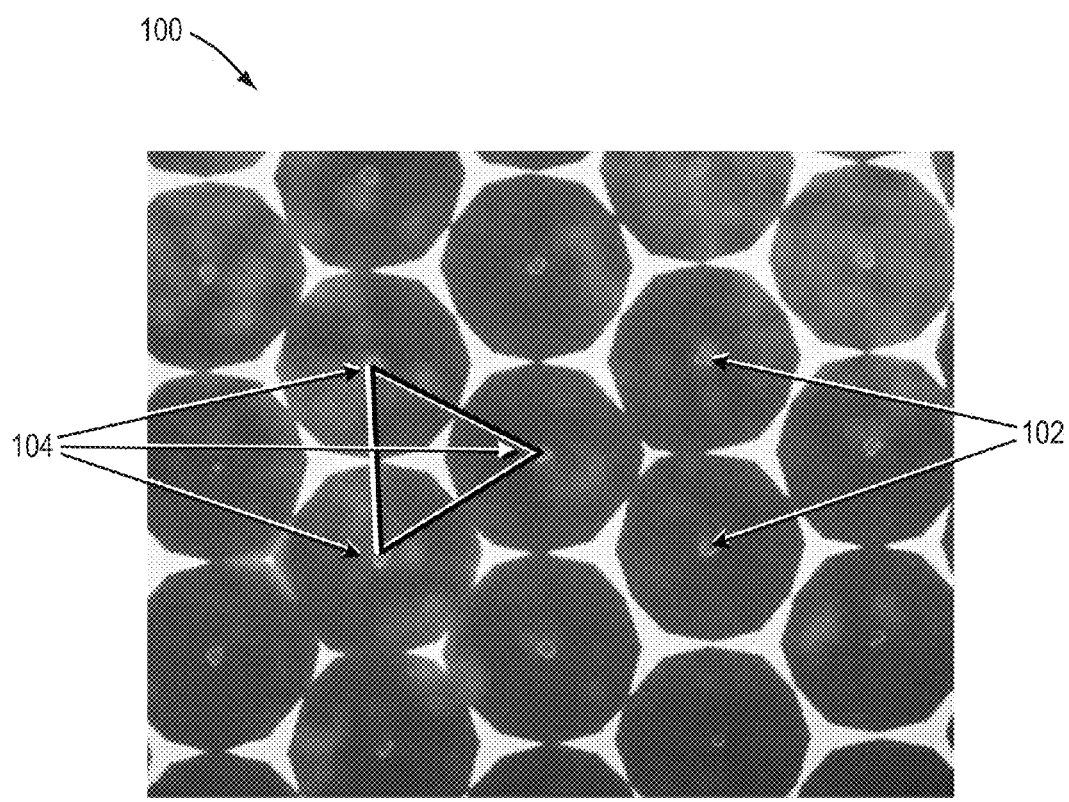
FIG. 1 is a simplified diagram illustrating a substrate having patterned dislocation bundle centers, according to certain embodiments.

FIG. 1 is a simplified diagram 100 illustrating a substrate having patterned dislocation bundle centers. As shown in FIG. 1, the dislocation bundle centers 102 are aligned. The regions between cores are "non-core" regions that have lower dislocation density. Usually, regions around (but not including) the dislocation bundle centers (e.g., the non-dislocation bundle centers) are suitable for making devices, such as LED devices and laser devices. It is to be appreciated that various embodiments of the present disclosure provide techniques for efficiently dicing substrates that have patterned dislocation bundle centers. In various embodiments, the non-dislocation bundle centers may be intentionally doped (e.g., with silicon, oxygen, germanium) to provide a desired level of conductivity. According to the dicing techniques described herein very little substrate material is removed during the dicing process, and the dislocation bundle centers become the corner areas of the devices that are formed by dicing the substrate and, in so doing, three or more corners 104 are formed.

In various embodiments, the substrate or die area is aligned. During the dicing process, the dislocation bundle centers are substantially removed (i.e., as part of the kerf loss in the dicing process). As a result, the removed dislocation bundle centers are not a part of the active device region. In certain embodiments, the dislocation bundle centers are masked off so that they are not electrically injected during device operation. It is to be appreciated that these approaches help avoid the dislocation bundle centers having an impact to the active device material, thereby allowing for high performance, high-reliability, and long-lived device operation.

In various embodiments, the dislocation bundle centers are arranged according to the underlying mask on the GaAs wafer prior to HVPE growth of GaN. As a result, various pattern arrangements are possible such that optical devices can be shaped with three or more corners.

Figure 2:
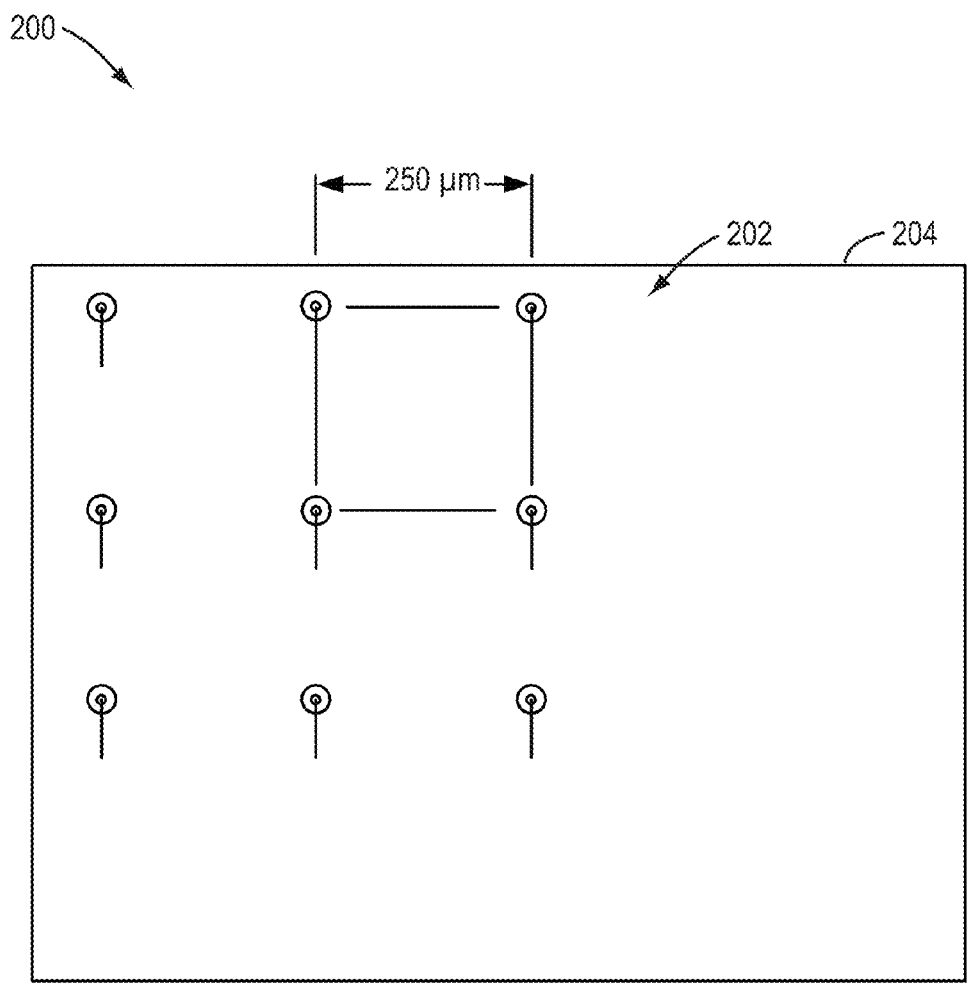
FIG. 2 is a simplified diagram illustrating techniques for dicing a substrate, according to certain embodiments.

FIG. 2 is a simplified diagram 200 illustrating techniques for dicing a substrate. This diagram is merely an example, which should not unduly limit the scope of the claims. One of ordinary skill in the art would recognize many variations, alternatives, and modifications.

As shown in FIG. 2, dislocation bundle centers on the substrate 204 are aligned in a square lattice configuration 202. To form devices, the substrate shown in FIG. 2 is diced along the lines defined by the dislocation bundle centers. For example, a square-shaped or rectangular-shaped device having one side length of about 250 microns is formed by dicing the substrate through the dislocation bundle centers. Each side of the device is defined by two adjacent dislocation bundle centers.

Figure 3:
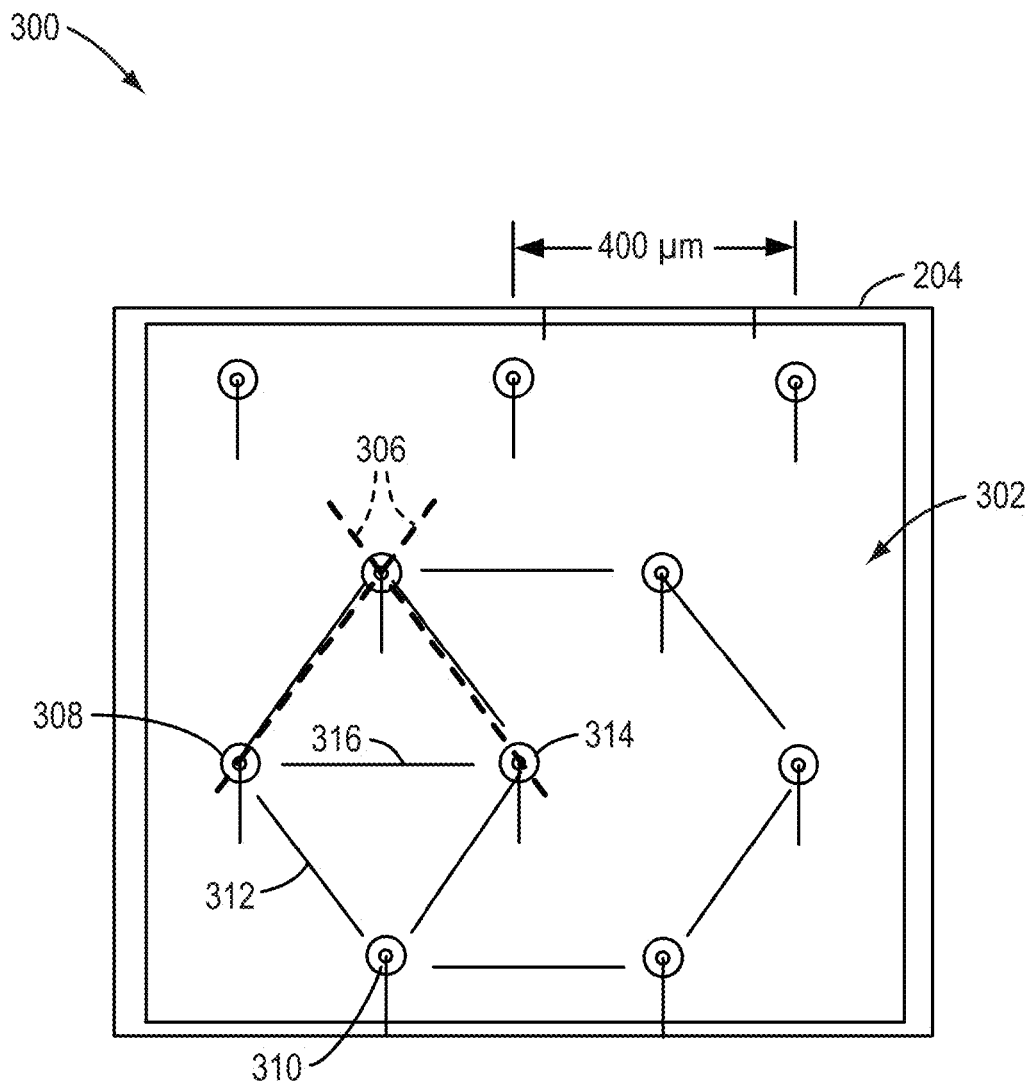
FIG. 3 is a simplified diagram illustrating techniques for dicing a substrate having dislocation bundle centers in a hexagonal pattern, according to certain embodiments.

It is to be appreciated that depending on the pattern of the dislocation bundle centers, devices can be diced into other shapes as well, such as a diamond shape, a triangular shape, etc. FIG. 3 is a simplified diagram 300 illustrating techniques for dicing a substrate having dislocation bundle centers in a hexagonal pattern. This diagram is merely an example, which should not unduly limit the scope of the claims. One of ordinary skill in the art would recognize many variations, alternatives, and modifications.

As shown in FIG. 3, dislocation bundle centers are evenly spaced and aligned horizontally and diagonally. It is to be appreciated that according to certain embodiments of the present disclosure, a hexagonal core pattern 302 is diced for triangular- or diamond-shaped devices. Depending on the application, diamond or triangular shaped devices can provide advantages in light extraction efficiency.

According to certain embodiments, the present disclosure provides a method for processing substrates. The method includes providing a substrate 204, which substrate comprises gallium and nitrogen material. For example, the substrate is a GaN based substrate formed by crystalline growth processes. Depending on the application, the substrate surface may be configured in a polar, non-polar, or semi-polar orientation. The substrate has a plurality of dislocation bundle centers. In certain embodiments, the substrate is polished after the growing process. As explained above, the dislocation bundle centers are formed during the crystal growth process. For example, the dislocation bundle centers comprise high dislocation densities and are unsuitable for making devices.

The dislocation bundle centers are aligned according to a predetermined pattern, which is typically based on the pattern of the mask that is used to grow the substrate. Depending on the application, the pattern can be square (as shown in FIG. 2), hexagonal (as shown in FIG. 3), or others. For example, dislocation bundle centers may be spaced about 100 microns to 1,500 microns from one another. Depending on the growth process and tools used, the dislocation bundle centers can be about 10 microns to about 100 microns in diameter. In certain embodiments, the dislocation bundle centers can be doped with oxygen, and the core-free regions are silicon-doped to make the core-free regions n-type.

As explained above, to conserve valuable substrate regions that are free from the dislocation bundle centers, dicing of the substrate is performed along dicing lines 306 that pass through the dislocation bundle centers. In an embodiment, a first dislocation bundle center 308 and a second dislocation bundle center 310 are located. A first line 312 is defined. The first line 312 connects at least the first dislocation bundle center and the second dislocation bundle center, the first line being substantially straight. To dice the substrate to form a number of devices, additional lines that pass through dislocation bundle centers are defined. In certain embodiments, a third dislocation bundle center 314 is located. A second line 316 is defined. The second line 316 connects at least the first dislocation bundle center and the third dislocation bundle center, and the second line 316 is substantially straight. As shown in this example, the second line can be at a non-perpendicular angle to the first line, and the device defined by the first and the second lines is triangular- or diamond-shaped. It is to be appreciated that other shapes are possible as well. For example, following the square lattice configuration 202 of FIG. 2, the second line can be perpendicular to the first line.

Dicing of substrates is performed along at least the first and second lines. Depending on the application, various methods can be used for dicing. For example, diamond scribing, breaking, cutting, and other techniques or combinations thereof can be used for dicing the substrate into die having straight edges. Further, dicing can be accomplished by laser scribing, laser ablation of the substrate, stealth laser dicing, and/or other laser scribing techniques, followed by a breaking (e.g., mechanical breaking along the scribe lines). Where scribing or breaking methods are used, very little substrate material is removed during the dicing process, and the dislocation bundle centers become the corner areas of the devices that are formed by dicing the substrate and, in so doing, three or more corners 104 are formed (FIG. 1). In certain laser scribing processes, up to about 30 microns of material are removed by the laser while about 10 microns of material is lost at cleaving. Two or more dicing passes may be performed in order to scribe along each edge of a device. Using the diamond scribing process, the material loss can be as low as 10 microns. In various types of sawing processes, about 20 microns to 100 microns of material are lost. In certain embodiments, substrates are diced through the dislocation bundle centers, which may be substantially removed or partially removed depending on the amount of material being removed during the dicing process. In certain embodiments, dicing is accomplished by an etching process, where an etching mask exposes the dislocation bundle centers completely so that the dislocation bundle centers are etched away.

Depending on the size of the substrate, device geometry, and dislocation bundle center patterns, a substrate can be diced a number of times, and a number of devices are formed. In a device formed according to embodiments of the present disclosure, the device has at least a first corner, a second corner, and a third corner. The dislocation bundle centers are positioned on each of the corners of the device. To further process the device, a conductive region is defined on the device (see FIG. 5A and FIG. 5B). The area where the conductive region is formed substantially free from dislocation bundle centers and thus can be used for forming active and conductive regions of the device. For example, active layers are formed within the active region. In certain embodiments, the device is polished.

In certain embodiments, dislocation bundle centers can be considered to be at or near the center of the devices, and a particular configuration of device geometry based on the dislocation bundle center patterns can determine the pattern, according to which pattern the substrate is diced. Such patterns allow to dice to be formed from the wafers in many configurations. Still further, other configurations of dislocation patterns (e.g., such as stripes instead of center-distributed sites) are reasonable and envisioned, and devices can be formed using the dicing techniques described herein.

In certain embodiments, dicing the substrate involves cutting the substrate (e.g., using mechanical cutting tools). For example, a thickness of up to 35 microns or more of substrate material may be removed (e.g., kerf loss) during the cutting process. The cutting processes themselves can cause removal of substrate material, and the removed substrate material can include all or a portion of the substrate forming a shunt. As mentioned above, dislocation bundle centers are typically characterized by a diameter of less than 50 microns. As a result of the material loss during the cutting process, the dislocation bundle centers are effectively removed. In such cases, the devices formed by cutting the substrate are substantially free from dislocation bundle centers, and substantially all of the entirety of the device's areas can be used for forming active and conductive regions. The devices resulting from dicing the substrate can be used for various applications. For example, with further processing, the devices can be used to form LED and/or laser devices.

It is to be appreciated that the various processes and/or steps described above for dicing substrates and forming devices are not limiting. For example, various processes and/or or steps can be added, removed, replaced, re-arranged, repeated, overlapped, and/or modified. In an embodiment, corners of the device that include dislocation bundle center are masked when the device is further processed.

In certain embodiments, the present disclosure provides an optical device manufactured using the substrate described above. As an example, the substrate comprises GaN material and, for example, the optical device can be a LED or a laser device. The optical device includes a substrate that comprises three or more corners. For example, a triangular substrate comprises three corners, while a square substrate comprises four corners. Depending on the substrate shape, the substrate can have a larger number of corners. Each of the corners includes at least a dislocation bundle center characterized by a diameter of less than 50 microns. As explained above, dislocation bundle centers are typically intact if the substrate is diced by a scribing process. The substrate includes a predefined region free from dislocation bundle centers of the corners. The optical device includes an active region containing one or more active layers, and the active region is positioned within the predefined region. The optical device also includes a conductive region formed within the predefined region.

In certain embodiments, an optical device such as an optoelectronic device includes a substrate portion (from a substrate of the types described above) which is used for electrical injection into the active layers of the device. In such embodiments the non-dislocation bundle centers of the substrate are made conductive. This may be accomplished by intentionally doping the substrate layers during the substrate crystal growth process. Suitable dopants include silicon which may be provided by flowing silane or di-silane during the crystal growth process. Typically doping levels are in concentrations from about $3E17$ $cm^{-3}$ to about $8E18$ $cm^{-3}$, but may be higher.

Figure 4:
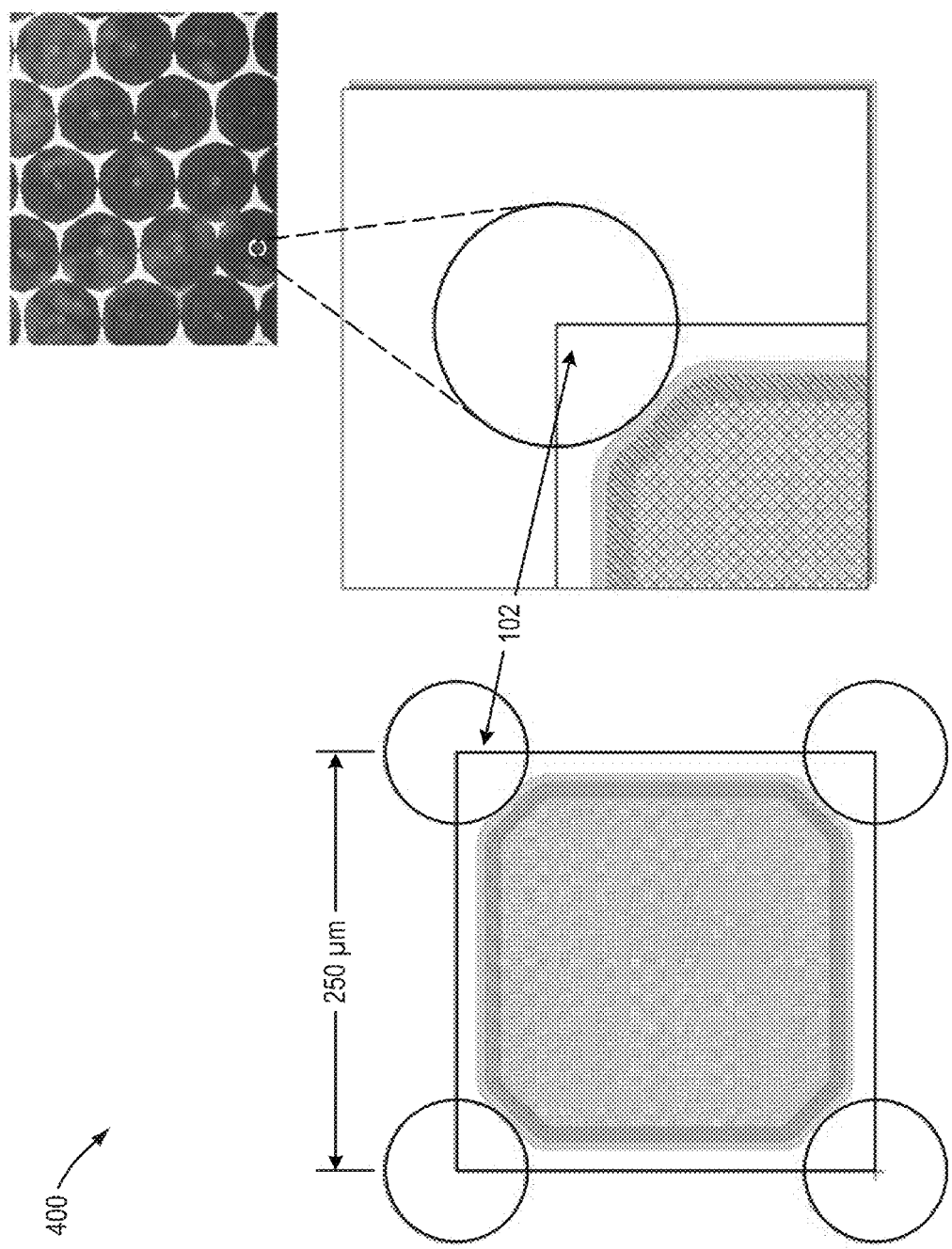
FIG. 4 is a plan view diagram of an electrical contact designed to confine electrical injection into a predefined region that avoids dislocation bundle centers, according to certain embodiments.

FIG. 4 is a simplified diagram 400 illustrating the substrate portion of an optoelectronic device. This diagram is merely an example, which should not unduly limit the scope of the claims. One of ordinary skill in the art would recognize many variations, alternatives, and modifications. As shown in FIG. 4, an exemplary substrate has a length of 250 µm. The dislocation bundle centers are located at the four corners of the substrate. The active regions of the device are to be formed at the non-dislocation bundle centers. In certain embodiments, a die pattern (e.g., as defined by lithography, metal deposition, and/or etching) is 'dog-eared' (truncated) to avoid the dislocation bundle center in the substrates. This dog-eared shape substantially eliminates exposure to the shunt path (see shunt path 506 of FIG. 5).

Figure 5A:
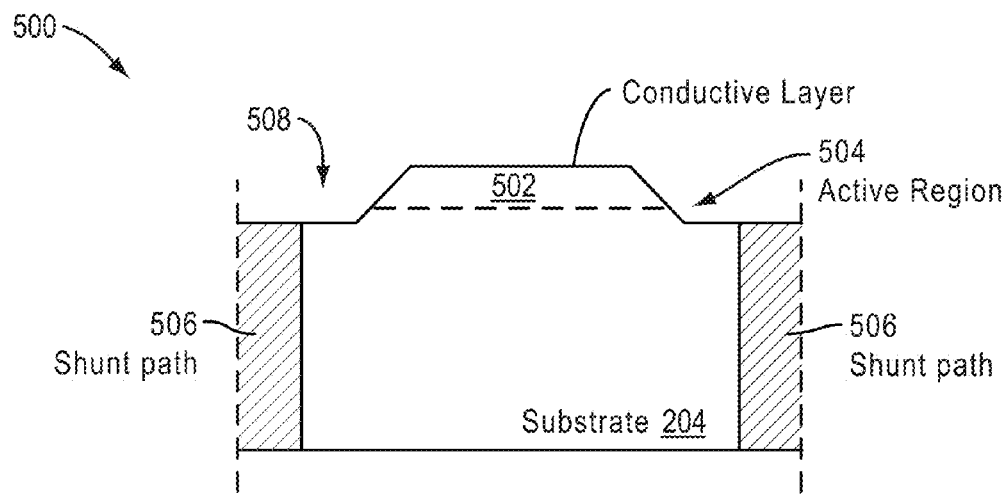
FIG. 5A is a side view of an optical device showing a portion of a conductive layer, according to certain embodiments.

FIG. 5A is a side view of an optical device 500 showing a portion of a conductive layer. As shown, the material around the dislocation bundle centers is substantially removed (e.g., see the area 508). More specifically, the side view shows that a conductive layer 502 is deposited atop the substrate 204, thus forming an active region 504. During the processes as described herein, a portion of the material is removed at or near the corners, and this has the effect of substantially eliminating exposure to the shunt path 506. The side view as shown in FIG. 5A depicts the dog-eared shape introduced above (see FIG. 4).

Figure 5B:
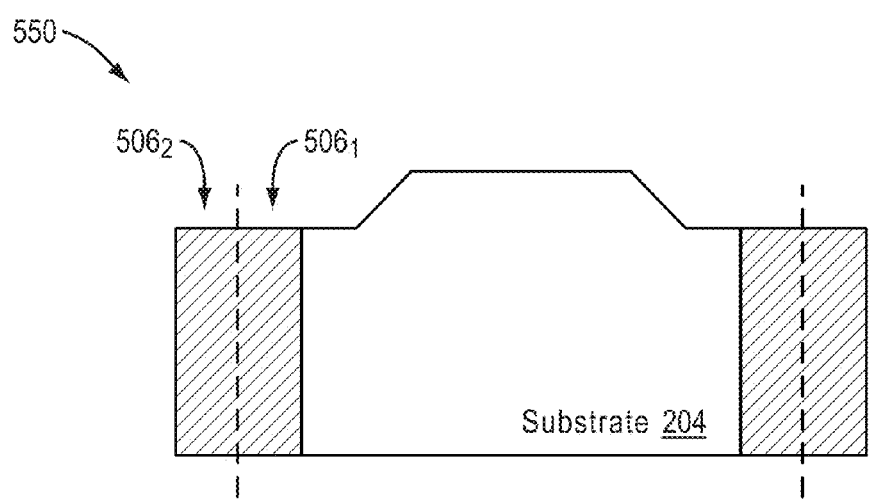
FIG. 5B is a side view of an optical device showing a juxtaposition to a shunt path, and a neighboring shunt path, according to certain embodiments.

FIG. 5B is a side view of an optical device 550 showing a juxtaposition to a shunt path 506₁, and a neighboring shunt path 506₂. As shown, when the material around the dislocation bundle centers is substantially removed, this has the effect of substantially eliminating exposure to the shunt path for adjacent areas, which adjacent areas become neighboring devices after separation into individual die. In certain embodiments, the present disclosure provides for an optical device having dislocation bundle centers configured as conductive regions, which remain substantially intact or partially intact in the optical device. Further details of this optical device can be found throughout the present specification and more particularly below.

Figure 6:
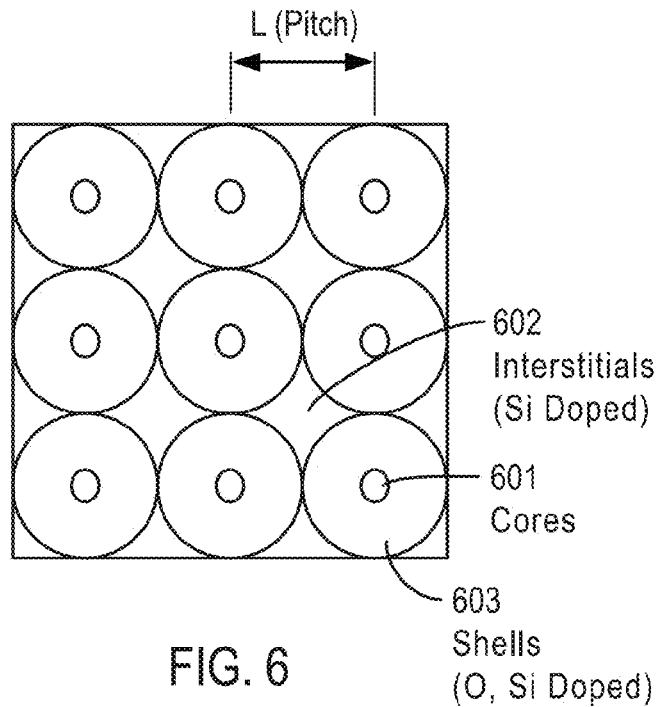
FIG. 6 is a simplified top-view diagram of a substrate having patterned dislocation bundle centers.

FIG. 6 is a simplified top-view diagram of a substrate having patterned dislocation bundle centers. As shown in FIG. 6, the dislocation bundle centers 601 are aligned. The regions between cores 601 are "non-core" regions 602 (interstitial regions) that have lower dislocation density. Usually, regions around (but not including) the dislocation bundle centers (e.g., the non-dislocation bundle centers or shells 603) are suitable for making devices, such as LED devices and laser devices. It is to be appreciated that various embodiments of the present disclosure provide techniques for efficiently dicing substrates that have patterned dislocation bundle centers. In various embodiments, the non-dislocation bundle centers may be intentionally doped (e.g., with silicon, oxygen, germanium) to provide a desired level of conductivity. According to the dicing techniques described herein very little substrate material is removed during the dicing process, and the dislocation bundle centers become the corner areas of the devices that are formed by dicing the substrate and, in so doing, three or more corners are formed. In certain embodiments, the substrate or die area is aligned. During the dicing process, the dislocation bundle centers are not substantially removed. As a result, the dislocation bundle centers are a part of a contact region configured to the active device region.

In certain embodiments, the dislocation bundle centers are arranged according to the underlying mask on the wafer prior to HVPE growth of GaN. As a result, various pattern arrangements are possible such optical devices can be shaped with three or more corners. Of course, there can be other variations.

Figure 7:
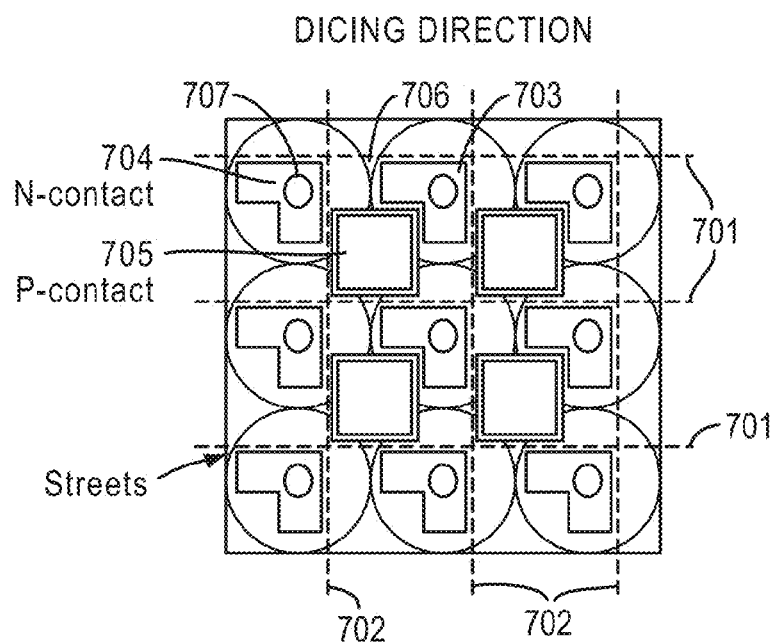
FIG. 7 is a simplified diagram illustrating techniques for dicing a substrate, according to certain embodiments.

FIG. 7 is a simplified diagram illustrating techniques for dicing a gallium and nitrogen containing substrate according to certain embodiments. As shown, the top view of the substrate includes a plurality of first lines 701 configured in a horizontal manner, and a plurality of second lines 702 configured in a vertical manner. The top view shows a plurality of optical devices 703, each of which includes an n-contact region 704, a p-contact region 705, interstitials regions 706, cores 707, and shells 708. As shown, the core regions 707 are configured to be the n-contact region, as will be explained further below. A core region 707 is configured within a vicinity of a center region of each of the optical devices. The p-type contact region 705 is formed within a corner region, which can be configured among four separate optical devices or chips, as shown.

Figure 8:
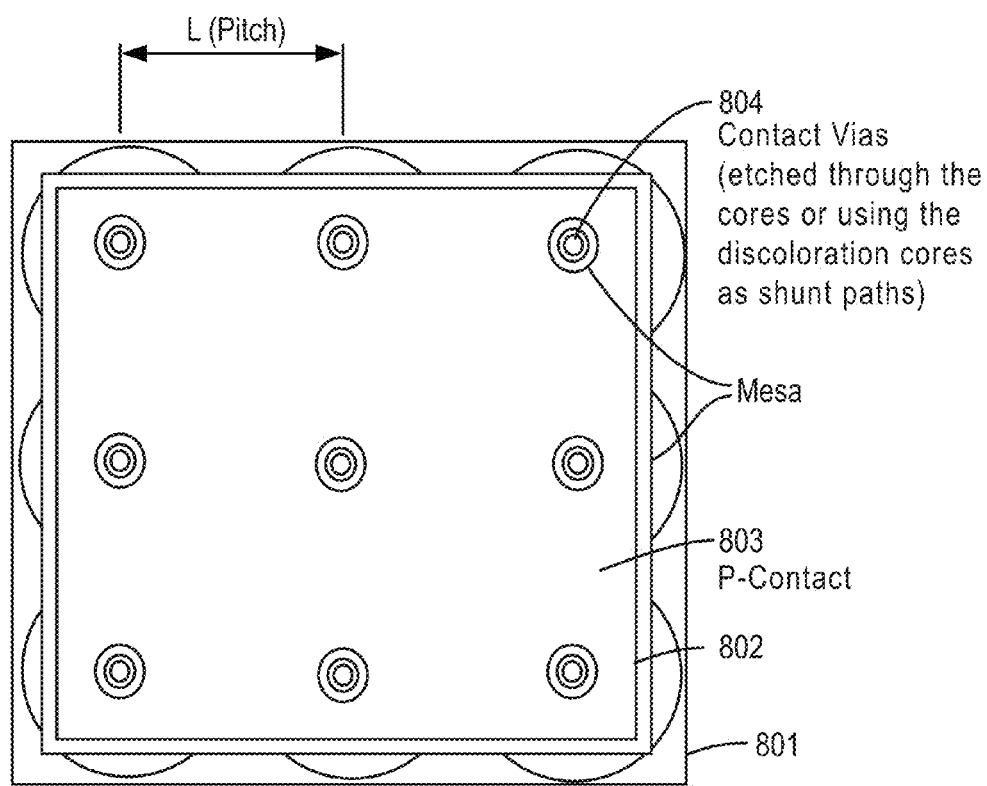
FIG. 8 is a simplified diagram illustrating a flip chip architecture, according to certain embodiments.

FIG. 8 is a simplified diagram illustrating a flip-chip architecture, according to certain embodiments. As shown, the substrate 801 surface is mounted in a flip chip configuration to a second substrate member 802. The substrate 801 is shown underlying the p-type contact region 803 including a plurality of n-type contact vias 804. Each of the n-type contact vias 803 is configured to connect to the dislocation bundle centers via an etching process, again as will be explained below in FIG. 10.

Figure 9:
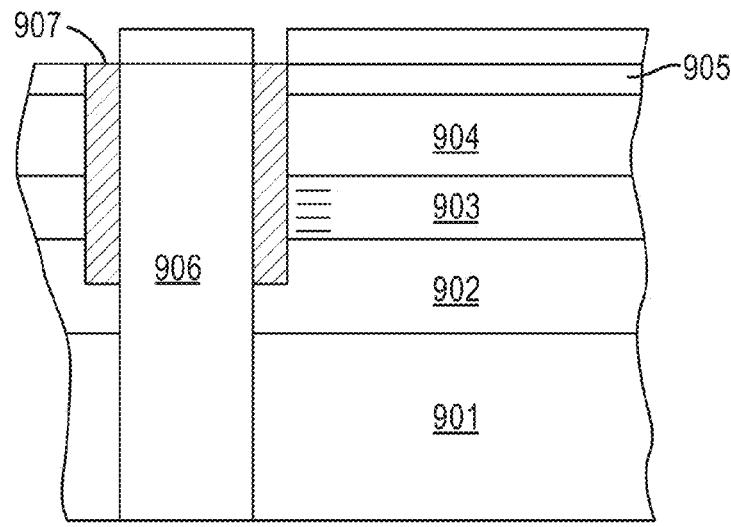
FIG. 9 is a cross-sectional view of the substrate of FIG. 6 and FIG. 7.

FIG. 9 is cross-sectional view of the substrate structure according to FIG. 6 and FIG. 7. As shown, the optical device includes a gallium and nitrogen containing substrate 901, an overlying n-type GaN region 902, a quantum well region 903, a p-type GaN region 904, and a p+ type contact region 905 overlying the p-type GaN region 904. The core region 906, which extends from an upper surface of the device to a lower surface of the device, is coupled electrically and physically to the n-type GaN region 902 and substrate 901. The core region 906, however, is insulated form the quantum well region 903 and from the p-type GaN region 904, as shown by an annular insulating material thickness 907 configured around an upper portion of the core region 906. The insulating material can be a dielectric such as silicon dioxide, silicon nitride, or spin-on-glass (SOG), among other materials. In certain embodiments, the annular region 907 surrounding the core region 906 is masked and etched to expose a trench structure surrounding the core region 906, which is later filled with the insulating material. Of course, there can be other variations. The dielectric can be deposited by evaporation techniques or chemical vapor techniques or by wet-chemical techniques or by spin coating techniques. The depth of the trench may be less than 0.5 m, but can have variations.

Figure 10:
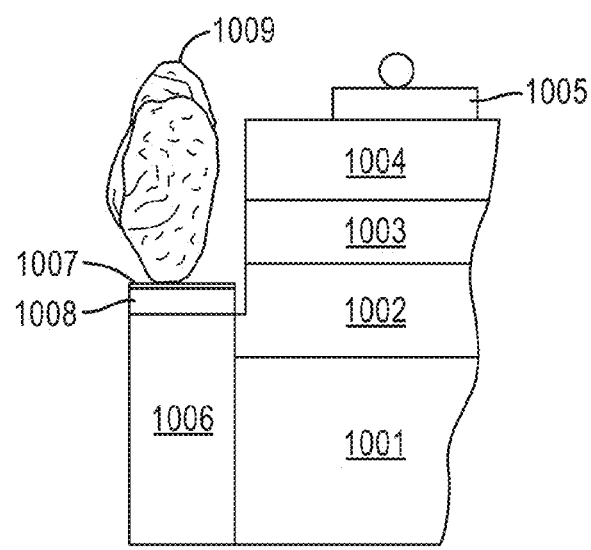
FIG. 10 is a cross-sectional view of the flip chip architecture of FIG. 8.

FIG. 10 is a cross-sectional view of the flip chip architecture, of FIG. 8. As shown, the optical device includes a gallium and nitrogen containing substrate 1001, an overlying n-type GaN region 1002, a quantum well region 1003, a p-type GaN region 1004, and a p+ type contact region 1005 overlying the p-type GaN 1004. The core region 1006, which extends from a portion of the n-type GaN region 1002 to a lower surface of the device, is coupled electrically and physically to the n-type GaN region 1002 and to the substrate 1001. The core region 1006, however, is insulated form the quantum well region and p-type GaN region 1003, as shown by being free and removed from any contact with the quantum well region 1003 and from the p-type GaN region 1004. The insulation may be air or a dielectric such as silicon dioxide, silicon nitride or spin-on-glass. A metal contact region 1007 is formed overlying an n-type contact 1008, which is overlying the core region 1006, as shown. (Also, as shown in FIG. 9).

In a different flip-chip configuration and referring to FIG. 10, a mesa region 1009 is etched down to the n-type contact 1008. A metal contact region 1007 is formed overlying the n-type contact 1008, which is overlying the core region 1006, as shown in FIG. 10. Stud-bumps 1009 are formed to make electrical contact to the recessed region consisting of the n-contact to the LED.

In certain embodiments, various techniques can be used to dice the substrate in accordance to the dislocation bundle center pattern. In certain embodiments, the present specification describes one or more specific gallium and nitrogen containing surface orientations, but it would be recognized that any one of a plurality of family of plane orientations can be used. The above description and illustrations should not be taken as limiting the scope of the present disclosure which is defined by the appended claims.

What is claimed is:

1. A method for manufacturing optical devices comprising:
   providing a substrate, the substrate comprising gallium and nitrogen material, the substrate having a plurality of dislocation bundle centers, the plurality of dislocation bundle centers being aligned according to a predetermined pattern;
   locating at least a first dislocation bundle center and a second dislocation bundle center;
   isolating at least one dislocation bundle center using an isolation region between the at least one dislocation bundle center and an active region and a p-type region;
   separating at least one optical device comprising a portion of the substrate configured with the at least one dislocation bundle center; and
   using the at least one dislocation bundle center as an n-type contact region.

2. The method of claim 1, comprising:
   forming active layers overlying the substrate; and
   wherein the isolating comprises forming a trench region surrounding the at least one dislocation bundle center and forming an isolation region within the trench region, the isolation region comprising a material selected from an oxide material, a nitride material, a spin-on-glass material, and a combination of any of the foregoing.

3. The method of claim 1, wherein the separating comprises dicing the substrate with a cutting pattern based on the predetermined pattern, the cutting pattern comprising a plurality of substantially straight lines.

4. The method of claim 1, wherein the optical device is characterized by a triangular shape.

5. The method of claim 1, comprising forming a p-type contact region over the p-type region.

6. A method for manufacturing an optical device comprising:
   providing a substrate, the substrate comprising gallium and nitrogen material, the substrate having a plurality of dislocation bundle centers, the plurality of dislocation bundle centers being aligned according to a predetermined pattern;
   locating at least a first dislocation bundle center and a second dislocation bundle center;
   defining a first line, the first line connecting at least the first dislocation bundle center and the second dislocation bundle center, the first line being substantially straight;
   locating a third dislocation bundle center;
   defining a second line, the second line connecting at least the first dislocation bundle center and the third dislocation bundle center, the second line being substantially straight;
   cutting the substrate along the first line;
   cutting the substrate along the second line; and
   forming the optical device comprising at least one of the dislocation bundle centers configured as a contact region, the optical device having a first edge formed by cutting the substrate along the first line.

7. The method of claim 6, wherein each of the plurality of dislocation bundle centers is characterized by a diameter of less than 50 microns.

8. The method of claim 6, wherein cutting the substrate along the first line removes a portion of the substrate, the portion of the substrate being characterized by a thickness of at least 30 microns.

9. The method of claim 6, comprising forming an active region on the optical device.

10. The method of claim 6, comprising forming a conductive region on the optical device.

11. The method of claim 6, comprising cutting the substrate along a third line, the third being substantially straight and connecting the second dislocation bundle center and the third dislocation bundle center.

12. The method of claim 6, comprising forming an LED using the optical device.

13. The method of claim 6, comprising forming a laser using the optical device.

* * * * *